(12) United States Patent
Yoshizawa

(10) Patent No.: US 7,022,607 B2
(45) Date of Patent: Apr. 4, 2006

(54) MASK AND ITS MANUFACTURING METHOD, AND METHOD FOR MANUFACTURING SEMICONDUCTOR DEVICE

(75) Inventor: Masaki Yoshizawa, Kanagawa (JP)

(73) Assignee: Sony Corporation, (JP)

( * ) Notice: Subject to any disclaimer, the term of this patent is extended or adjusted under 35 U.S.C. 154(b) by 0 days.

(21) Appl. No.: 10/250,555

(22) PCT Filed: Nov. 15, 2002

(86) PCT No.: PCT/JP02/11939

§ 371 (c)(1),
(2), (4) Date: Jul. 2, 2003

(87) PCT Pub. No.: WO03/043065

PCT Pub. Date: May 22, 2003

(65) Prior Publication Data

US 2004/0045929 A1   Mar. 11, 2004

(30) Foreign Application Priority Data

Nov. 16, 2001 (JP) .............................. 2001-352014

(51) Int. Cl.
*H01L 21/00* (2006.01)
(52) U.S. Cl. .......................... 438/689; 430/5; 430/312; 430/311; 430/313
(58) Field of Classification Search ................ 438/942, 438/948, 950; 430/5, 311–313; 257/618; 216/41

See application file for complete search history.

(56) References Cited

U.S. PATENT DOCUMENTS

| 4,417,946 A * | 11/1983 | Bohlen et al. ................. 216/2 |
| 5,234,781 A * | 8/1993 | Sakamoto et al. ............. 430/5 |
| 5,756,237 A * | 5/1998 | Amemiya ........................ 430/5 |
| 2003/0031936 A1* | 2/2003 | Mangat et al. ................. 430/5 |
| 2004/0045929 A1* | 3/2004 | Yoshizawa ..................... 216/41 |

FOREIGN PATENT DOCUMENTS

JP    5-216216 A1    8/1993
JP    07-047324       2/1995

(Continued)

OTHER PUBLICATIONS

International Search Report, Dec. 24, 2002.

(Continued)

*Primary Examiner*—Laura M. Schillinger
(74) *Attorney, Agent, or Firm*—Rader, Fishman & Grauer PLLC; Ronald P. Kananen

(57) ABSTRACT

To provide a mask able to reduce the thickness of a membrane and maintain the mask strength and a method of producing a semiconductor device able to form a fine pattern with a high accuracy and a method of producing the mask. A mask comprising a thin film, holes formed at the thin film through which a charged particle beam (preferably an electron beam) passes, a support layer formed at one side of the thin film, and apertures formed at a larger size than the holes at least at portions of said holes of said support layer and a method of producing the same and a method of producing a semiconductor device including a lithography step using the same.

25 Claims, 9 Drawing Sheets

FOREIGN PATENT DOCUMENTS

| | | |
|---|---|---|
| JP | 08-306614 | 11/1996 |
| JP | 10-321493 | 12/1998 |
| JP | 11-329938 | 11/1999 |
| JP | 2000-243692 A1 | 9/2000 |
| JP | 2000-323379 A1 | 11/2000 |
| JP | 2001-44103 A1 | 2/2001 |
| JP | 2001-291482 A1 | 10/2001 |

OTHER PUBLICATIONS

H.C. Pfeiffer et al., Journal of Vacuum Science and Technology, B17, 1999, p. 2840, vol. 17, Issue 6.

H.C. Pfeiffer et al., Journal of Vacuum Science and technology, B17, p. 117-125, "Low Energy e-beam Proximity Projection Lithography".

* cited by examiner

MASK AND ITS MANUFACTURING METHOD, AND METHOD FOR MANUFACTURING SEMICONDUCTOR DEVICE

TECHNICAL FIELD

The present invention relates to a mask for charged particle projection lithography and a method of producing the same and a method of producing a semiconductor device including a charged particle projection lithography step.

BACKGROUND ART

Along with the miniaturization of LSIs, there are hopes for the commercialization of electron beam projection lithography (EPL). As the EPL being commercialized, PREVAIL (projection exposure with variable axis immersion lenses) technology jointly announced by IBM and Nikon can be mentioned. PREVAIL technology is described for example in H. C. Pfeiffer et al., *Journal of Vacuum Science and Technology*, B17, p. 2840 (1999).

Further, LEEPL (low energy electron-beam proximity projection lithography) technology jointly announced by LEEPL Corporation, Tokyo Seimitsu Co., Ltd., and Sony can be described as another EPL. LEEPL technology is described for example in T. Utsumi, Journal of Vacuum Science and Technology, B17, p. 2897 (1999).

As the PREVAIL mask and the LEEPL mask, stencil masks have been proposed. Stencil masks have a thin film dispersing, reflecting, or absorbing exposure beams such as electron beams and ion beams and holes formed with predetermined patterns for passing through the thin film. Since the exposure beam passes through the portions of holes passing through the thin film and is dispersed, reflected, or absorbed at the thin film except at the holes, a predetermined pattern is exposed. In stencil masks, the thin film formed with such holes is called a "membrane".

PREVAIL is generally a 4× reduction projection system. An electron beam of about 100 keV is used. When using a PREVAIL stencil mask for exposure, an electron beam is passed through only portions formed with holes without dispersal and is focused on a resist film to transfer a pattern. As the PREVAIL mask, a stencil mask having a 2 μm thick membrane composed of silicon has been proposed.

On the other hand, LEEPL is an equal magnification projection system. An electron beam of for example 2 keV is used. When using an LEEPL stencil mask for exposure, an electron beam is passed through only portions formed with holes to transfer a pattern at equal magnitude. As the LEEPL masks, stencil masks having 500 nm thick membranes composed of silicon or diamond have been proposed.

However, according to the above conventional stencil masks, when reducing the membrane thickness for the purpose of improving the processing of the mask to form a finer pattern, the mask strength falls. In particular, LEEPL stencil masks are thin in membrane thickness and fine patterns of equal magnitude as the transferred patterns are formed, so the drop in the mask strength easily becomes a problem.

In the case of using silicon as the membrane material, compared with the case of using diamond, the drop in the mask strength is more conspicuous. If the mask strength is insufficient, for example, when washing the masks or loading the masks at an exposure apparatus, the patterns easily break.

Further, if the area of the membrane is large, when making the membrane thickness thinner, the membrane easily flexes. If the membrane flexes, the positional precision of the pattern will drop or the pattern will become distorted. To form a fine pattern on a semiconductor device, it is necessary to prevent flexing and distortion of the membrane.

DISCLOSURE OF THE INVENTION

The present invention has as its object to provide a mask able to both reduce the membrane thickness and maintain the mask strength and a method of producing the same.

Further, the present invention has as its object to provide a method of producing a semiconductor device able to form a fine pattern with a high accuracy.

To achieve the above objects, the mask of the present invention is characterized by comprising a thin film, holes formed at the thin film through which a charged particle beam passes, a support layer formed at one side of the thin film, and apertures formed at a larger size than the holes at least at portions of said holes in said support layer. Preferably, the charged particle beam includes an electron beam.

Due to this, even if the thin film of a mask (membrane) is made thinner, the thin film is reinforced by the support layer and damage of the membrane is prevented. According to the mask of the present invention, the portions of the thin film except holes through which a charged particle beam passes are uniformly reinforced by the support layer. Further, it is possible to reduce the thickness of a thin film, so that the processability when forming holes can be improved. Therefore, the holes corresponding to the mask pattern are formed at the thin film with a high accuracy.

To achieve the above object, a method of producing a mask of the present invention is characterized by comprising the steps of forming a support layer via an assist layer at one side of a substrate; forming a thin film on said support layer; removing a portion of said substrate at another side of said substrate to expose a portion of said assist layer and forming a support frame composed of a portion of said substrate around exposure portions of said assist layer; forming holes at a portion of said thin film except portions of said support frame through which a charged particle beam passes; feeding an etching solution or an etching gas via said holes to said support layer to isotropically etch and form apertures at a larger size than said holes at least at portions of said holes in said support layer; and removing said assist layer except portions of said support frame.

Alternatively, the method of producing a mask of the present invention is characterized by comprising the steps of forming a thin film at one side of a substrate; forming a support layer on said thin film; removing a portion of said substrate at another side of said substrate to expose a portion of said thin film and form a support frame composed of a portion of said substrate around exposure portions of said thin film; forming an assist layer on said support layer; forming holes at a portion of said thin film except portions of said support frame through which a charged particle beam passes; feeding an etching solution or an etching gas via said holes at said support layer to etch isotropically and form apertures at a larger size than said holes at least at portions of said holes in said support layer; and removing said assist layer.

Due to this, it becomes possible to remove the support layer contacting the hole portions by self-alignment with the holes. Therefore, it is able to reinforce portions of the thin film except the holes by the support layer. Further, since the apertures of the support layer are formed at a larger size than the holes by self-alignment with the holes, the charged particle beam is not obstructed by the support layer.

To achieve the above object, a method of producing a semiconductor device of the present invention is a method of producing a semiconductor device having a step of irradiating a charged particle beam on a photosensitive surface via a mask on which a predetermined mask pattern is formed to transfer said mask pattern on said photosensitive surface, characterized by using a mask comprising a thin film; holes formed by said mask pattern in said thin film through which a charged particle beam passes; a support layer formed at one side of said thin film; apertures formed at a larger size than said holes at least at portions of said holes in said support layer; a support frame for supporting said thin film formed via an assist layer at least on a portion of said support layer except at said apertures; and said assist layer having resistance to an etching solution or an etching gas for forming said apertures at said support layer.

Alternatively, a method of producing a semiconductor device of the present invention is a method of producing a semiconductor device having a step of irradiating a charged particle beam on a photosensitive surface via a mask on which a predetermined mask pattern is formed to transfer said mask pattern on said photosensitive surface characterized by using a mask comprising a thin film; holes formed by said mask pattern in said thin film through which a charged particle beam passes; a support layer formed at one side of said thin film; apertures formed at a larger size than said holes at least at portions of said holes in said support layer; and a support frame for supporting said thin film formed at least at a portion of said thin film except at said holes.

Due to this, damage of a mask at the time of use, at the time of conveyance, or at the time of washing is prevented. Further, since the thin film of the mask is reinforced by the support layer, flexing of the thin film is prevented and positional deviation or distortion of the pattern caused by flexing of the thin film are reduced. Therefore, in charged particle projection lithography, it is possible to transfer a fine pattern with a high accuracy.

BEST MODE FOR CARRYING OUT THE INVENTION

Below, embodiments of a mask, a method of producing a mask, and a method of producing a semiconductor device of the present invention will be described with reference to the accompanying drawings.

(First Embodiment)

Figure 1:
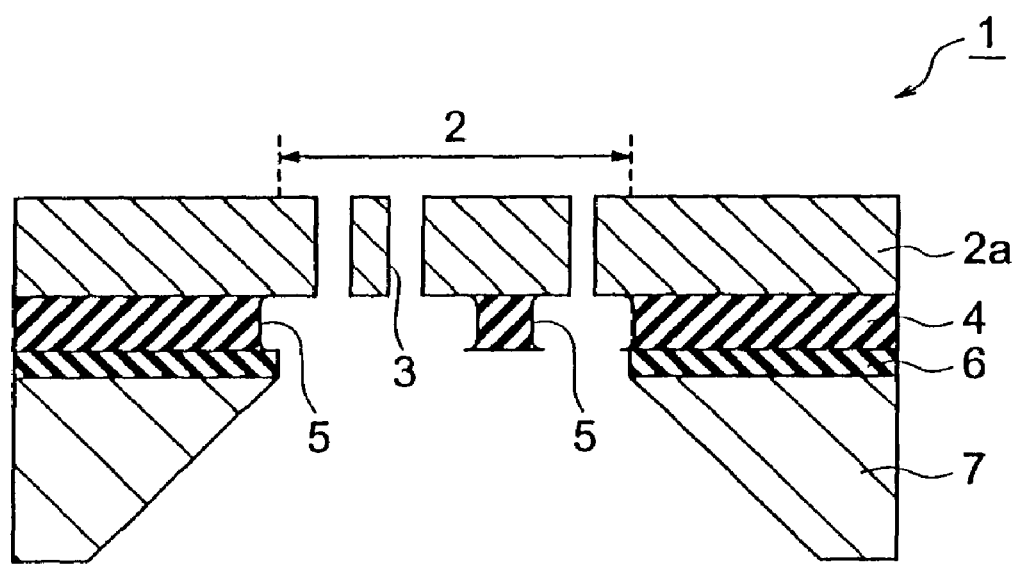
FIG. 1 is a cross-sectional view of a stencil mask according to a first embodiment of the present invention.

FIG. 1 is a cross-sectional view of a mask according to the present embodiment. A stencil mask 1 of the present embodiment is preferably used for LEEPL. As shown in FIG. 1, the stencil mask 1 has a membrane 2. The membrane 2 is for example comprised of a silicon layer 2a provided with holes 3 at certain parts. The holes 3 pass through the membrane 2 and are formed corresponding to the mask pattern.

In the case of an LEEPL stencil mask of an equal magnification projection system, the size of the membrane 2 is several mm to several tens of mm square or roughly equal to the size of a chip. As the material of the membrane 2, diamond etc. can be used in addition to silicon. The thickness of the membrane 2 is for example 500 nm, but it is also possible to suitably change this in accordance with the energy of the electron beam used for EPL or the material or the thickness of the support layer 4 etc.

At one side of the membrane 2, a silicon oxide film of a thickness of for example 300 nm is formed as the support layer 4. The portions of the support layer 4 contacting the holes 3 are removed by self-alignment with the holes 3. Due to this, apertures 5 of larger size than the holes 3 are formed at the support layer 4.

The material of the support layer 4 may be changed to another material so long as it has resistance to the etchant used for the etching to form the holes 3 at the membrane 2 and can support the membrane 2. For example, a silicon nitride film, a silicon oxynitride film, diamond, diamond-like carbon (DLC), a metal, etc. can be used as the material of the support layer 4.

The surface of the membrane 2 at the opposite side to the support layer 4 is formed with a silicon nitride film of for example 100 nm thickness as the assist layer 6. The silicon nitride film of the assist layer 6 is used as for example an etching stopper layer as explained below. Below, the assist layer 6 in the present embodiment was used as an etching stopper layer, but the assist layer 6 is not limited to an etching stopper layer. The layer for forming the membrane 2 (silicon layer 2a in example of FIG. 1) or the layer stacked on the support layer 4 is made the assist layer. As shown in FIG. 1, the etching stopper layer 6 of the membrane 2 portion is removed.

The stencil mask 1 is formed with a support frame 7 so as to surround the membrane 2. The frame 7 is provided for the purpose of reinforcing the mechanical strength of the membrane 2 and preventing damage to the membrane 2 when producing and when using the stencil mask 1. The frame 7 is formed by etching the silicon wafer by a frame pattern based on the pattern of the membrane 2. Namely, it is possible to use part of a silicon wafer as the frame 7.

According to the stencil mask 1 of the above present embodiment, since the membrane 2 other than the vicinities of the holes 3 is reinforced by the support layer 4, damage of the membrane 2 is prevented. Further, since the support layer 4 is formed with apertures 5 larger than the holes 3 by self-alignment with the holes 3, the support layer 4 does not affect transfer of the pattern. Further, since the membrane 2 is reinforced by the support layer 4, reduction of the thickness of the membrane 2 is possible. Therefore, the processability of the membrane 2 is improved, and it is easy to form a fine pattern at the membrane 2 with a high accuracy.

Figure 2A:
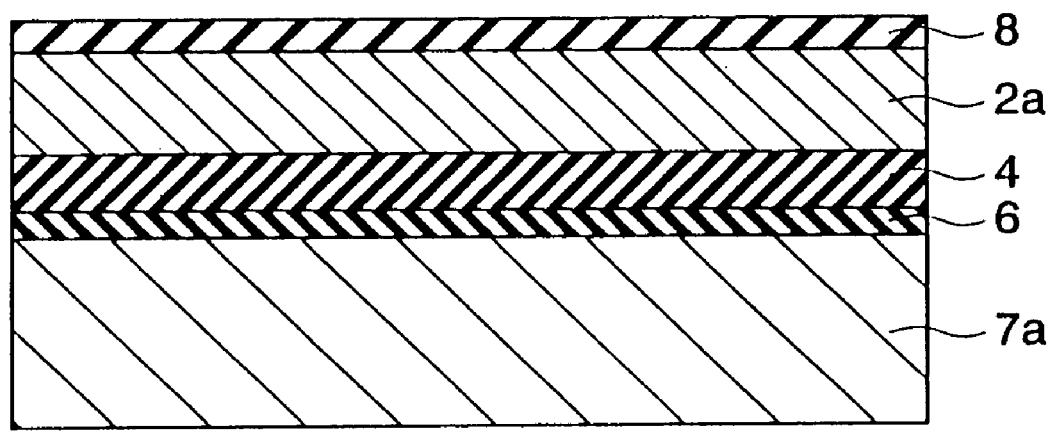
FIG. 2A to FIG. 2D are cross-sectional views of steps of a method of producing a stencil mask according to the first embodiment of the present invention.

Next, a method of producing a mask of the present embodiment will be described. First, as shown in FIG. 2A, the silicon wafer 7a is formed with for example a silicon nitride film as an etching stopper layer 6 by chemical vapor deposition (CVD).

Above this is formed for example a silicon oxide film as a support layer 4 by CVD. In addition, a single crystal silicon layer 2a for forming the membrane 2 is formed by for example epitaxial growth on the support layer 4. Alternatively, a polycrystalline silicon layer or an amorphous silicon layer may be formed by CVD instead of the single crystal silicon layer. However, a single crystal silicon layer is desirable from the viewpoint of mechanical strength.

On the silicon layer 2a, for example, a silicon oxide film is formed as a protection layer 8 by CVD. As the protection layer 8, it is possible to use a layer other than a silicon oxide film so long as it is resistant to the etchant used for etching the silicon wafer 7a.

Figure 2B:
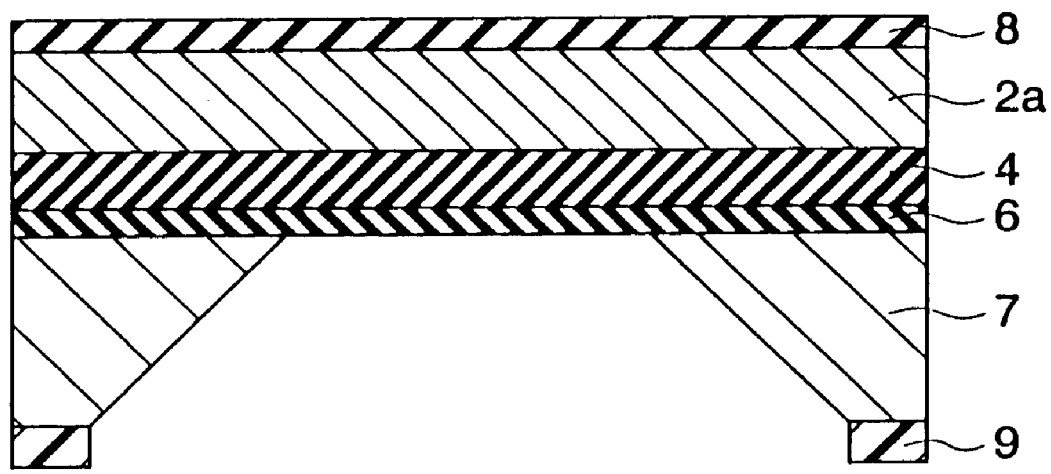

Next, as shown in FIG. 2B, the resist 9 is formed by the frame pattern based on the pattern of the membrane 2 (see FIG. 1) at the back side of the silicon wafer 7a. Next, the resist 9 is used as a mask for wet etching the silicon wafer 7a to form the frame 7. As the etchant of the wet etching, it is possible to use for example potassium hydroxide (KOH) or tetramethylammonium hydroxide (TMAH).

Next, the resist 9 and the protection layer 8 are removed. If forming a silicon oxide film as the protection layer 8, the protection layer 8 can be removed by wet etching using for example a buffer solution (BHF solution) including hydrofluoric acid and ammonium fluoride.

Alternatively, it is possible to dry etch the silicon wafer 7a to form the frame 7. In this dry etching, for example a fluorine-based gas such as $SF_6$ and $NF_3$ may be used as an etchant. However, in the case of dry etching, etching of the resist also easily proceeds, so sometimes the resist is removed completely before etching of the thickness of the silicon wafer 7a is finished.

For preventing this case, for example a thermal oxide film etc. may be formed as an etching mask layer at the back side of the silicon wafer 7a in advance. After using the resist as a mask to etch the etching mask layer, it is possible to etch the silicon wafer 7a to etch by the amount of thickness of the silicon wafer 7a by a predetermined pattern to form the frame 7.

Figure 2C:
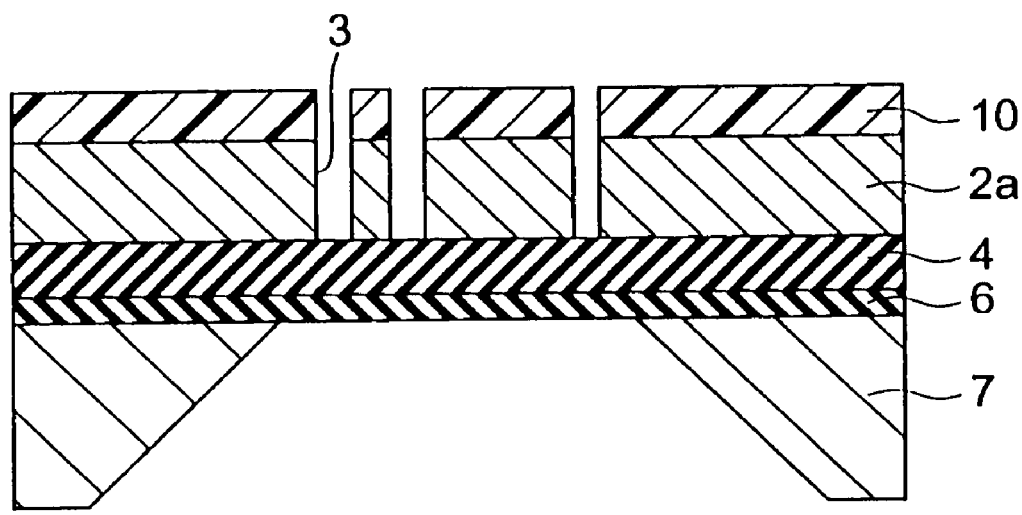

Next, as shown in FIG. 2C, the silicon layer 2a is formed on it with the resist 10 in the pattern of the holes 3 (see FIG. 1). The resist 10 is used as a mask to, for example, dry etch the silicon layer 2a and form the holes 3. After that, the resist 10 is removed.

Figure 2D:
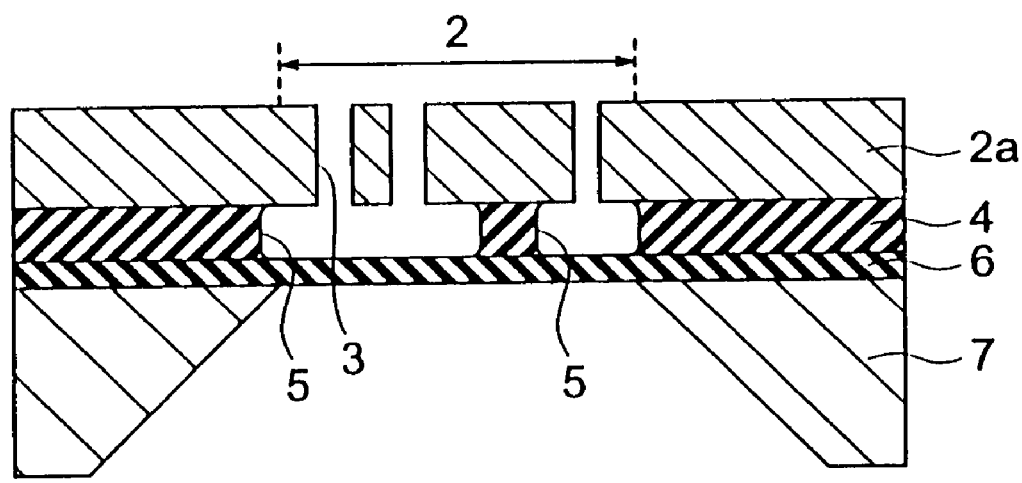

Next, as shown in FIG. 2D, an etching solution or an etching gas is supplied from the silicon layer 2a side via the holes 3 to isotropically etch the support layer 4. When forming a silicon oxide film as the support layer 4, for example a BHF solution is used as an etching solution to form apertures 5 of a larger size than the holes 3 by self-alignment with the holes 3. Here, due to the formation of the etching stopper layer 6, the etching proceeds in the support layer 4.

After that, as shown in FIG. 1, the frame 7 is used as a mask to etch the etching stopper layer 6 and remove the membrane 2 portion of the etching stopper layer 6. When forming a silicon nitride film as the etching stopper layer 6, wet etching using for example hot phosphoric acid can be used to selectively remove the etching stopper layer 6 as opposed to the silicon oxide film of the support layer 4 or the silicon layer of the membrane 2. According to the above steps, the stencil mask 1 of the present embodiment is formed.

The method of producing a semiconductor device of the present embodiment includes an LEEPL step using the stencil mask 1 of the present embodiment. The wafer is arranged at the membrane 2 side of the stencil mask 1 of FIG. 1 and an electron beam is irradiated from the frame 7 side. The electron beam passes through the holes 3 to transfer the mask pattern at a resist on the wafer.

According to the stencil mask 1 of the present embodiment, the membrane 2 is reinforced and flexing of the membrane 2 is prevented, so positional deviation or distortion of the pattern is prevented. Therefore, in electron beam exposure, it is able to transfer a fine pattern with a high accuracy.

(Second Embodiment)

Figure 3A:
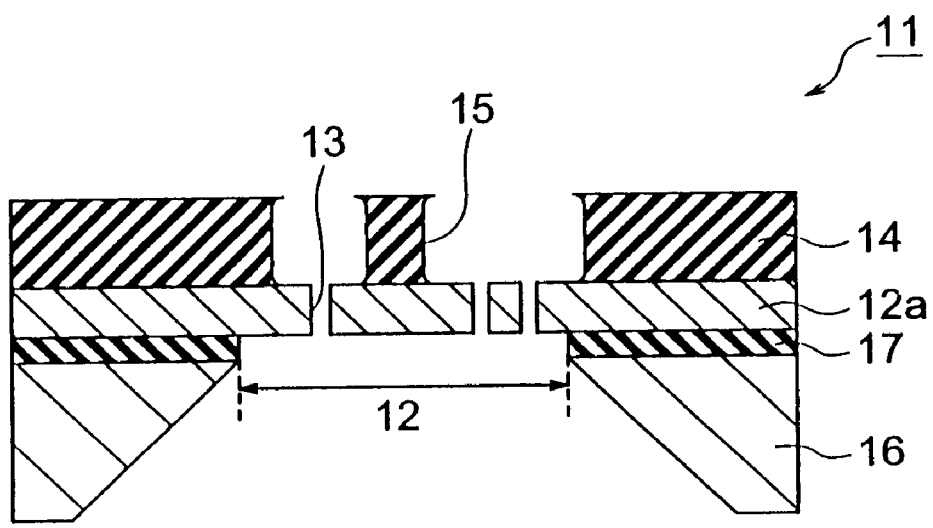
FIG. 3A is a cross-sectional view of a stencil mask according to a second embodiment of the present invention.

FIG. 3A is a cross-sectional view of a mask of the present embodiment. The stencil mask 11 of the present embodiment is suitably used for LEEPL. As shown in FIG. 3A, the stencil mask 11 has the membrane 12. The membrane 12 is for example a portion of the silicon layer 12a. Holes 13 corresponding to the mask pattern are formed at the membrane 12.

In the case of LEEPL stencil masks of the equal magnification projection system, the size of the membrane 12 is several mm to several tens of mm square or roughly equal to the size of a chip. As the material of the membrane 12, diamond etc. can be used in addition to silicon. The thickness of the membrane 12 is for example 300 nm, but it is also possible to suitably change this in accordance with the energy of the electron beam used for EPL, the material or the thickness of the support layer 14, etc.

One surface of the membrane 12 is formed with a silicon nitride film of a thickness of for example 500 nm as the support layer 14. The portions of the support layer 14 contacting the holes 13 are removed by self-alignment with the holes 13. Due to this, the support layer 14 is formed with apertures 15 of a larger size than the holes 13.

The material of the support layer 14 may be changed to another material so long as it is resistant to the etchant used for the etching for forming the holes 13 at the membrane 12 and can support the membrane 12. For example, a silicon oxide film, a silicon oxynitride film, diamond, DLC, a metal, etc. can be used as the material of the support layer 14.

The stencil mask 11 is formed with the frame 16 so as to surround the membrane 12. The frame 16 is provided for the purpose of reinforcing the mechanical strength of the membrane 12 and preventing damage of the membrane 12 at the time of producing and at the time of using the stencil mask 11. The frame 16 is formed by etching by a frame pattern based on the pattern of the membrane 12 on the silicon wafer.

The silicon layer 12a and the frame 16 have formed between them for example a silicon oxide film 17 of for example 100 nm thickness. The silicon oxide film 17 is used as an etching stopper layer when etching the silicon wafer to form the frame 16. The silicon oxide film 17 can be changed to an assist layer comprised of another material, but it is also possible to fabricate the frame 16 and the membrane 12 from an SOI wafer if there is a silicon oxide film 17 between the silicon layer 12a and the frame 16.

According to the stencil mask 11 of the present embodiment, since the membrane 12 except the vicinities of the holes 13 is reinforced by the support layer 14, damage of the membrane 12 is prevented. Further, since the support layer 14 is formed with apertures 15 at a larger size than the holes 13 by self-alignment with the holes 13, the support layer 14 does not affect the transfer of the pattern. Further, since the membrane 12 is reinforced by the support layer 14, reduction of the thickness of the membrane 12 is possible. Therefore, the processability of the membrane 12 is improved, and it becomes easy to form a fine pattern at the membrane 12 with a high accuracy.

Figure 3B:
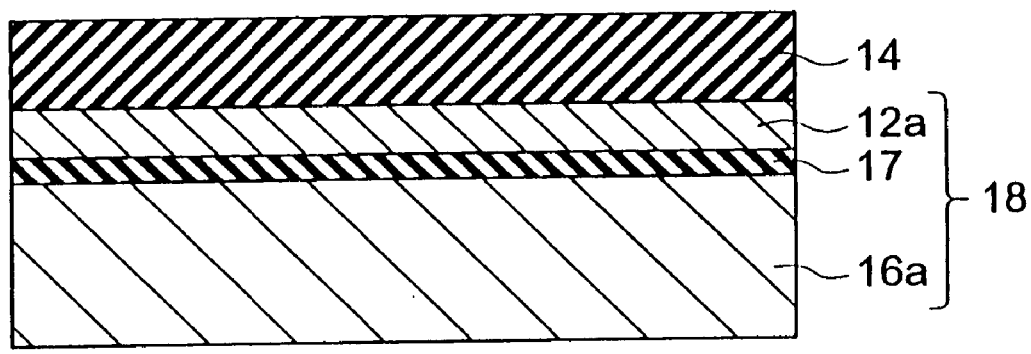
FIG. 3B to FIG. 3H are cross-sectional views of steps of a method of producing a stencil mask according to the second embodiment of the present invention.

Next, a method of producing a mask of the present embodiment will be explained. First, as shown in FIG. 3B, a silicon wafer 16a is formed with, for example, a silicon layer 12a via the silicon oxide film 17. The obtained SOI substrate 18 is formed with, for example, a silicon nitride film as the support layer 14 by CVD.

Figure 3C:
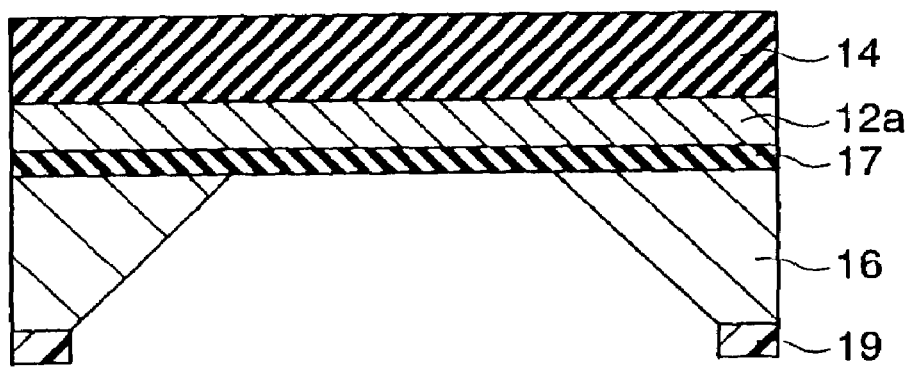

Next, as shown in FIG. 3C, a resist 19 is formed with the frame pattern based on the pattern of the membrane 12 (see FIG. 3A) at the back side of the silicon wafer 16a. Next, the resist 19 is used as a mask to etch the silicon wafer 16a to form the frame 16.

This etching is performed in the same manner as the first embodiment by wet etching or dry etching. At that time, the silicon oxide film 17 becomes an etching stopper layer. In the same manner as the first embodiment, although an etching stopper layer is one example of an assist layer, the assist layer is not limited to the silicon oxide film 17 as the etching stopper layer. After forming the frame 16, the resist 19 is removed.

Figure 3D:
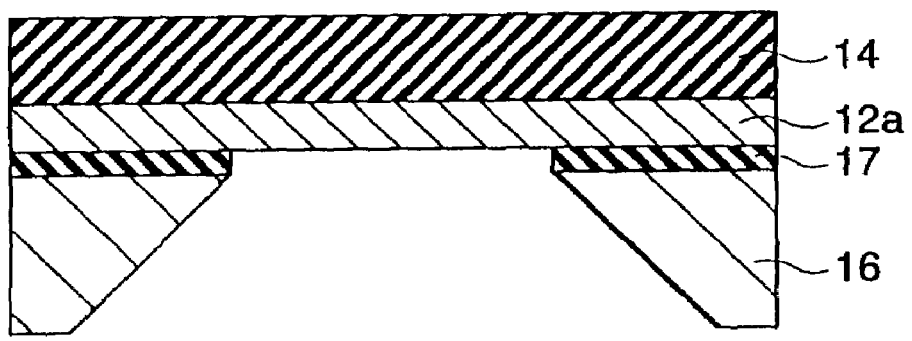

Next, as shown in FIG. 3D, the frame 16 is used as a mask to etch the silicon oxide film 17 and remove the silicon oxide film 17 at the membrane 12 portion (see FIG. 3A). This etching is made, for example, by wet etching using a BHF solution.

Figure 3E:
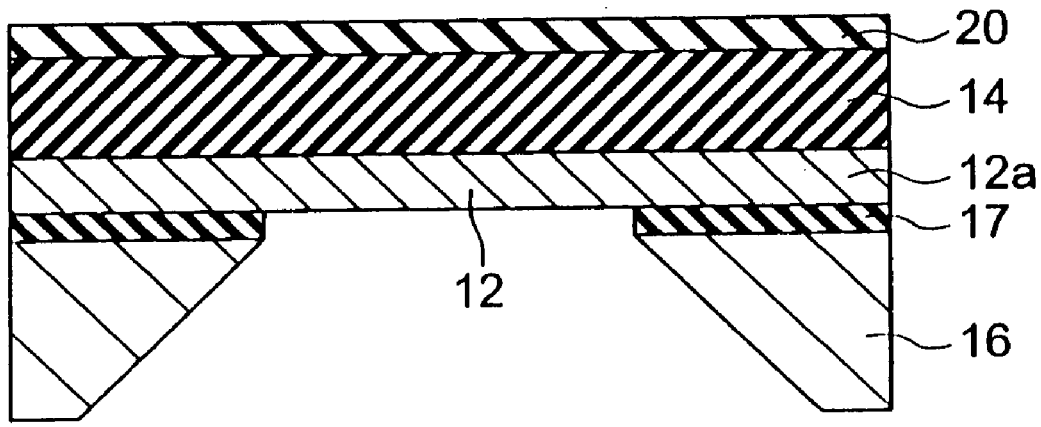

Next, as shown in FIG. 3E, a silicon oxide film of a thickness of, for example, 100 nm is formed as the etching stopper layer 20 on the support layer 14 by CVD. The material of the etching stopper layer 20 may be changed to another material so long as it is resistant to the etchant used for etching to form the apertures 15 (see FIG. 3A) at the support layer 14.

Figure 3F:
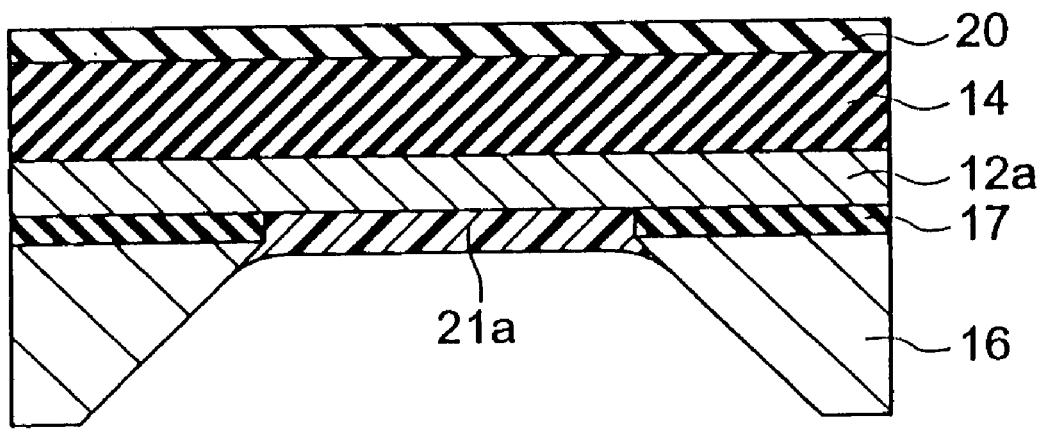

Next, as shown in FIG. 3F, the resist coating film 21a is formed at the surface at the frame 16 side of the membrane 12. At that time, since the resist-coated surface is surrounded by the frame 16, when spin coating a resist, the resist accumulates near the frame 16 and the resist cannot be coated with a uniform thickness.

Methods able to coat a resist on such a relief surface are disclosed in for example Japanese Patent No. 3084339, Japanese Unexamined Patent Publication (Kokai) No. 10-321493, Japanese Unexamined Patent Publication (Kokai) No. 8-306614, Japanese Unexamined Patent Publication (Kokai) No. 11-329938, or The 61$^{st}$ Extended Abstracts: The Japan Society of Applied Physics (2000), No. 2, p. 593, 4a-X-1.

According to the method described in Japanese Patent No. 3084339, a resist coating solution is applied to a substrate and spread thinly on the substrate by a scanner plate. The coating film is uniformly pressed on the substrate by air pressure from a slit-shaped nozzle tracking the scanner plate.

The method for forming a resist film described in Japanese Unexamined Patent Publication (Kokai) No. 10-321493 consists of the steps of coating a resist at the surface of a substrate, heating, for example, the bottom side of the substrate and cooling the upper side to change part of the resist coated film and thereby form a changed layer and an unchanged layer, and removing the unchanged layer.

According to the method for coating a resist described in Japanese Unexamined Patent Publication (Kokai) No. 8-306614, a resist is coated on the entire surface of the substrate by moving the substrate or nozzle and blowing the resist from the nozzle in a mist-like form.

According to the method for coating described in Japanese Unexamined Patent Publication (Kokai) No. 11-329938, nozzles are provided at several positions at predetermined intervals and a resist coating solution or other treatment solution is supplied from the nozzles while making these nozzles and the treated substrate move relative to each other.

Further, The 61$^{st}$ Extended Abstracts; The Japan Society of Applied Physics (2000) No. 2, p. 593, 4a-X-1, describes results of a method of nozzle scan coating moving an extra fine nozzle for dropping a resist back and forth in a y-direction and simultaneously moving the substrate at constant speed in an x-direction wherein the resist is coated in the presence of a thinner. In ordinary coating, the thickness increases at the edge portion, but if coating the resist in the presence of a thinner, local increases in the thickness are suppressed. For example, using the above method, a resist coating film 21a may be formed with a uniform thickness at the membrane 12 surrounded by the frame 16.

Figure 3G:
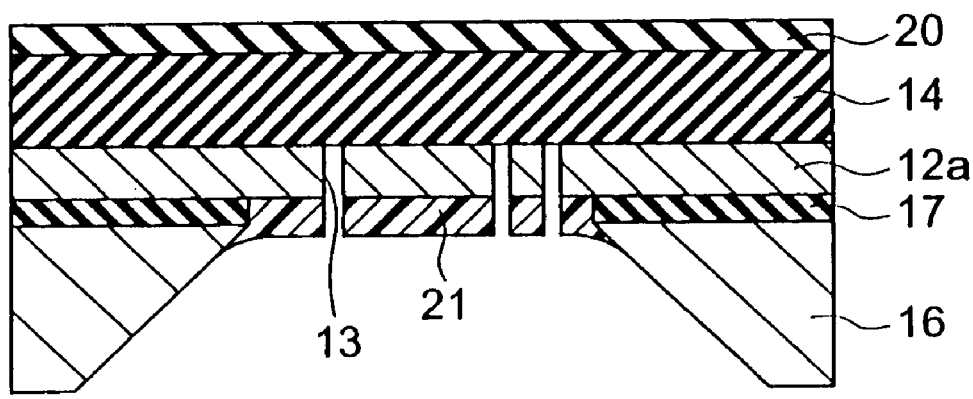

Next, as shown in FIG. 3G, the resist coating film 21a is exposed and developed to form the resist 21 to which the mask pattern is transferred. Next, the resist 21 is used as a mask to dry etch the membrane 12 from the frame 16 side to form the holes 13. For this dry etching, a fluorine-based gas such as $SF_6$ or $NF_3$ can be used as the etchant.

According to the method of producing a mask of the present invention, the membrane 12 is etched from the frame 16 side. Therefore, during etching, the entire surface of the etching stopper layer 20 contacts a stage of the etching apparatus and the etching surface is supported stably. Therefore, deformation of the membrane 12 because of heat etc. generated during etching can be prevented and the processing precision of a pattern can be improved. After forming the holes 13, the resist 21 is removed.

Figure 3H:
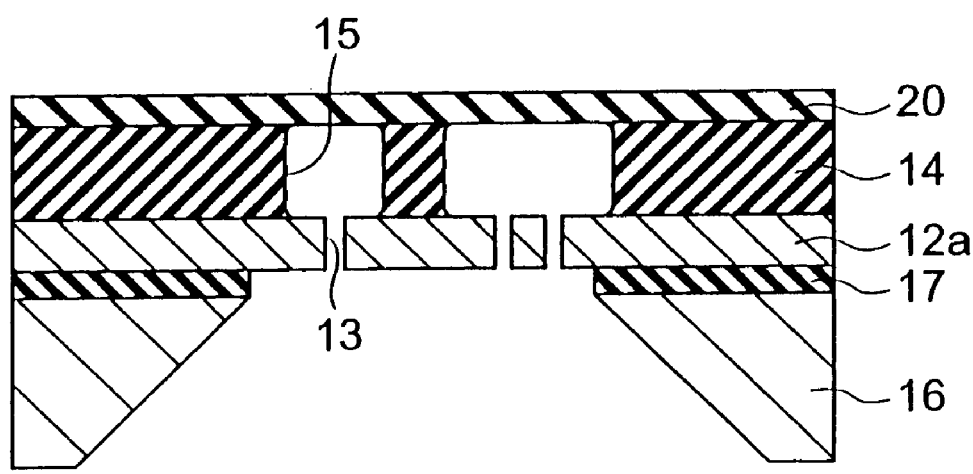

Next, as shown in FIG. 3H, the support layer 14 is supplied with an etching solution or an etching gas via the holes 13 from the membrane 12 side to perform isotropic etching. When forming a silicon nitride film as the support layer 14, apertures 15 larger in size than the holes 13 are formed by self-alignment with the holes 13, for example, by wet etching using hot phosphoric acid. Here, due to the etching stopper layer 20 being formed, the etching proceeds in the support layer 14.

Next, as shown in FIG. 3A, the etching stopper layer 20 is removed, for example, by wet etching using a BHF solution. Due to the above steps, the stencil mask 11 of the present embodiment is formed.

A method of producing a semiconductor device of the present embodiment includes an LEEPL step using the stencil mask 11 of the present embodiment. The wafer is arranged at the support layer 14 side of the stencil mask 11 in FIG. 3A. An electron beam is irradiated from the frame 16 side. The electron beam passes through the holes 13 to transfer the mask pattern on a resist on the wafer.

According to the stencil mask 11 of the present embodiment, the membrane 12 is reinforced and flexing of the membrane 12 is prevented, so positional deviation or distortion of the pattern is prevented. Therefore, in electron beam exposure, it is possible to transfer a fine pattern with a high accuracy.

(Third Embodiment)

Figure 4:
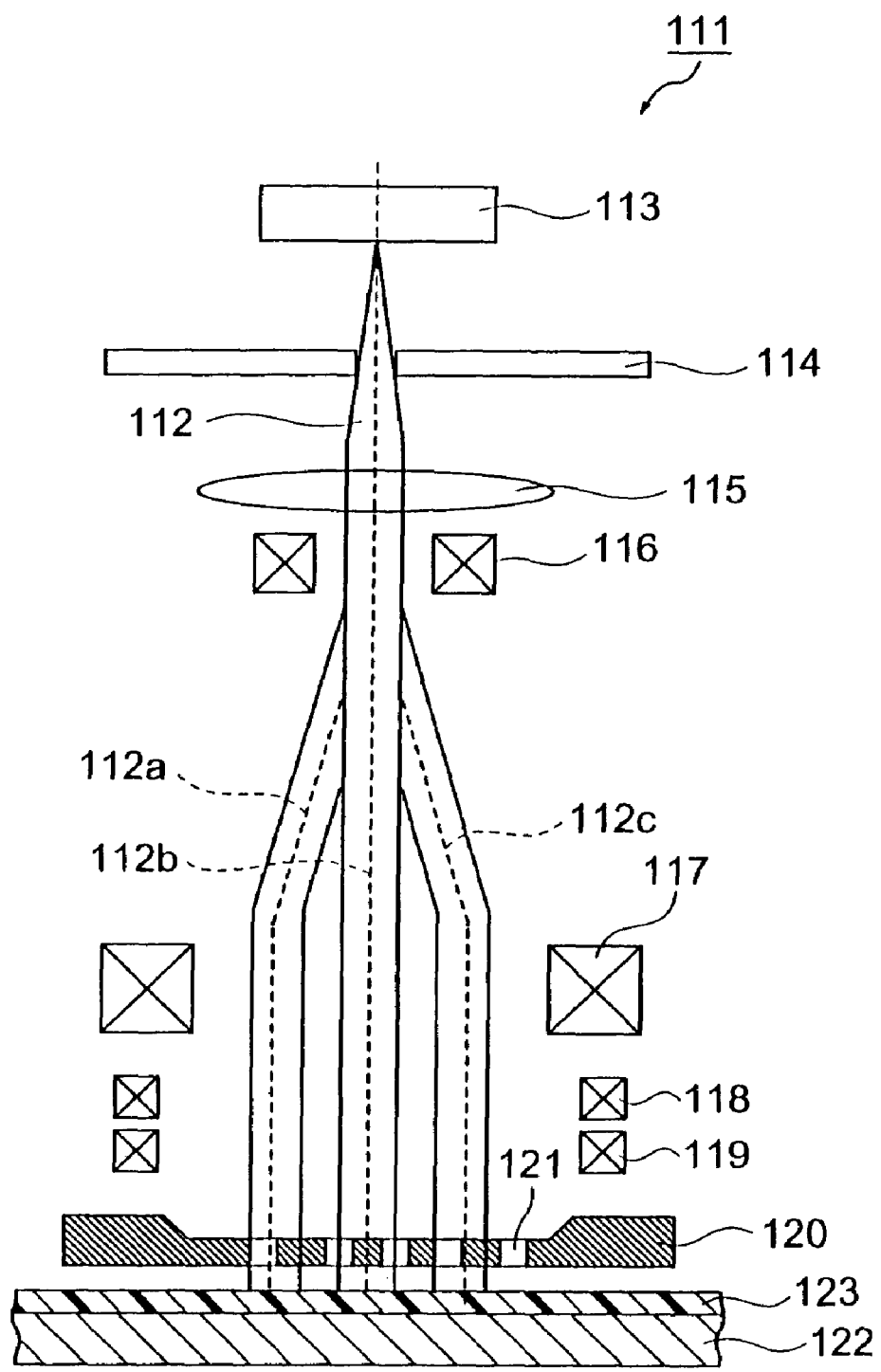
FIG. 4 is a schematic view of an example of a projection optical system of an electron beam according to a third embodiment of the present invention.

FIG. 4 is a schematic view of an exposure apparatus used for LEEPL and shows a projection optical system of an electron beam. The stencil mask of the first or second embodiment can be suitably used for electron beam exposure by the exposure apparatus shown in FIG. 4.

The exposure apparatus 111 of FIG. 4 has an electron gun 113 for generating an electron beam 112 and also an aperture 114, condenser lens 115, pair of main deflectors 116 and 117, and pair of fine adjustment deflectors 118 and 119.

The aperture 114 limits the electron beam 112. The condenser lens 115 converts the electron beam 112 into a parallel beam. The sectional shape of the electron beam 112 condensed by the condenser lens 115 is normally a circle, but may be another sectional shape as well. The main deflectors 116 and 117 and the fine adjustment deflectors 118 and 119 are deflector coils. The main deflectors 116 and 117 deflect the electron beam 112 so that the electron beam 112 strikes the surface of the stencil mask 120 basically perpendicularly.

The fine adjustment deflectors 118 and 119 deflect the electron beam 112 so that the electron beam 112 strikes the surface of the stencil mask 120 perpendicularly or inclined slightly from the perpendicular direction. Although the angle of incidence of the electron beam 112 is optimized according to the pattern position on the stencil mask 120 etc., the angle of incidence of the electron beam 112 is about 10 mrad even at the maximum. The electron beam 112 strikes the stencil mask 120 substantially perpendicularly.

The electron beams 112a to 112c shown in FIG. 4 show the state where the electron beam 112 scanning the stencil mask strikes positions on the stencil mask substantially perpendicularly and do not show the state where the electron beams 112a to 112c simultaneously strike the stencil mask 120. The scan by the electron beam 112 may be either of a raster scan or vector scan.

In FIG. 4, the resist 123 on the wafer 122 is exposed by the electron beam passing through the hole 121 parts of the stencil mask 120. For LEEPL, equal magnification masks are used. The stencil mask 120 and wafer 122 are arranged in proximity.

At that time of electron beam exposure by the above-mentioned exposure apparatus 111, the stencil mask of the first or second embodiment of the present invention is used as the stencil mask 120. In the stencil mask according to the first or second embodiment, the membrane is reinforced by a support layer, so flexing of the membrane is prevented and positional deviation of a transfer pattern in the electron beam exposure is reduced.

Further, since apertures of the support layer are formed by self-alignment with holes of the membrane, an electron beam passing through the hole portions is not blocked by the support layer. When not forming apertures at the support layer by self-alignment with the holes of the membrane, patterning of the resist for forming the apertures at the support layer and patterning of the resist for forming the holes at the membrane are performed independently and the resist is used as a mask for etching to form apertures at the support layer.

Although the apertures of the support layer can be formed by this method, in this case, if the alignment precision of patterning of the resist on the support layer and patterning of the resist on the membrane is not sufficient, the electron beam passing though the hole portions may be blocked by portions of the support layer. Therefore, when forming a fine pattern with a small margin of alignment, it is particularly preferred to form the apertures of the support layer by self-alignment with the holes of the membrane as shown in the first or second embodiment.

(Fourth Embodiment)

Figure 5:
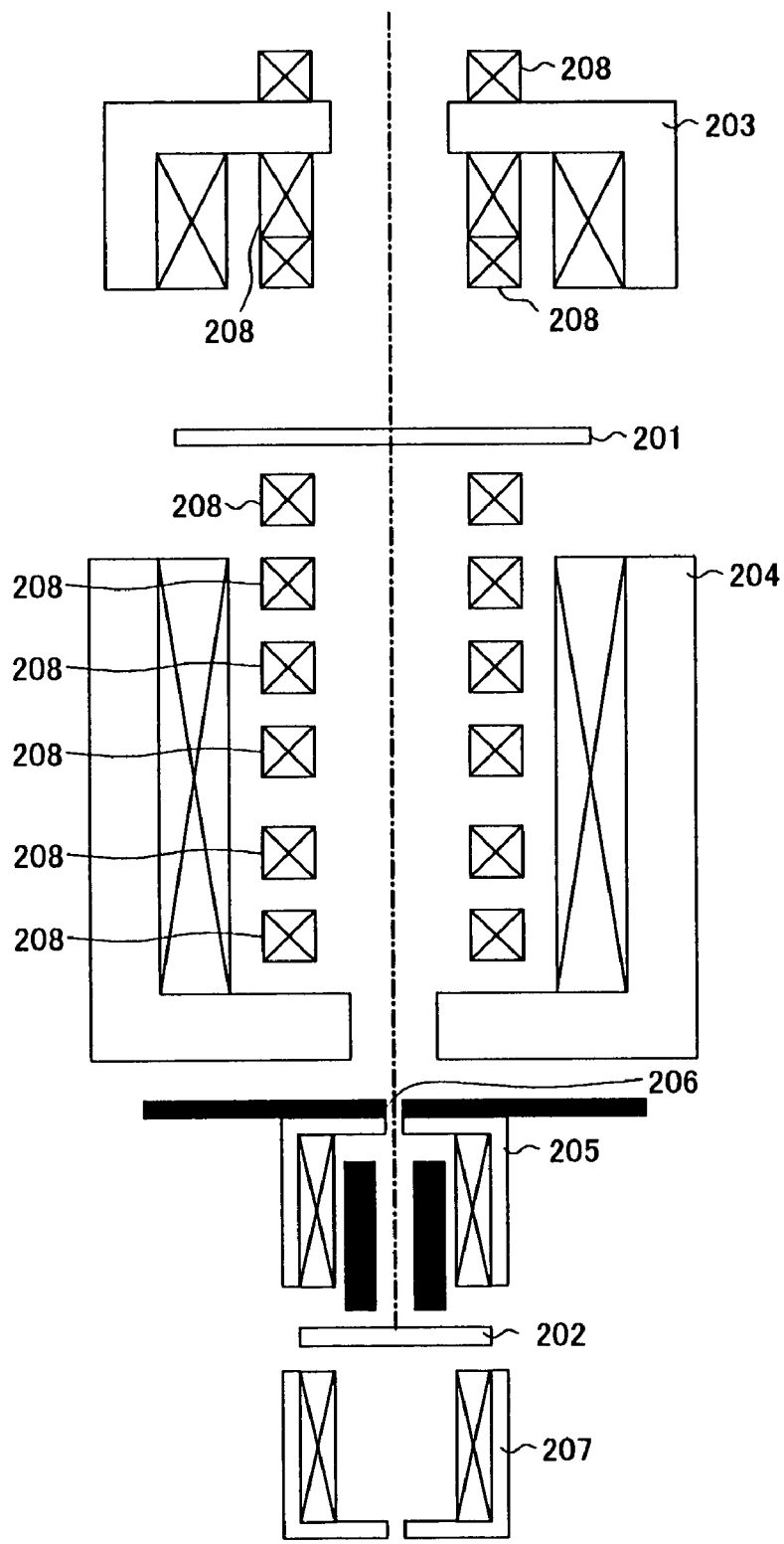
FIG. 5 is a schematic view of another example of a projection optical system of an electron beam according to a fourth embodiment of the present invention.

FIG. 5 is a schematic view of another example of a projection optical system of an electron beam exposure apparatus able to use the mask of the present invention. According to the projection optical system shown in FIG. 5, the pattern of the mask 201 is transferred reduced by a predetermined magnification to a wafer or other sample 210 etc. using an electron beam. The path of the electron beam is controlled by a condenser lens 203, first projection lens 204, second projection lens 205, crossover aperture 206, sample lens 207, and a plurality of deflectors 208.

In the projection optical system shown in FIG. 5, a deflection magnetic field is generated from the plurality of deflectors 208 so that the electron beam passing through the mask 201 passes through the crossover aperture 206 and perpendicularly strikes the sample 202. The mask of the present invention can also be used for the above projection optical system, another charged particle beam apparatus using a stencil mask, etc.

The above embodiments of the mask, the method of producing the same, and the method of producing a semiconductor device of the present invention are not limited to the above explanation. For example, the mask and the method of producing the same of the present invention can be used for charged particle projection lithography other than LEEPL. Specifically, the present invention can also be used for a PREVAIL or variable shape type electron beam direct drawing apparatus or ion beam lithography stencil mask and method for producing the same. Further, the present invention can be applied to an X-ray lithography mask and a method of producing the same. In addition, various modifications can be made within a scope not exceeding the gist of the present invention.

According to the mask of the present invention, it is possible to both reduce the thickness of a membrane and maintain mask strength.

According to the method of producing a mask of the present invention, it is possible to form a pattern on a membrane with a high accuracy and prevent damage of a membrane when producing a mask.

According to the method of producing a semiconductor device of the present invention, it is possible to transfer a fine pattern with a high accuracy in charged particle projection lithography.

What is claimed is:

1. A mask comprising:
   a membrane, at least one hole extending through said membrane;
   a support layer, at least one aperture extending though said support layer, said at least one aperture being self-aligned with said at least one hole, said at least one aperture being larger than said at least one hole;
   an assist layer, said support layer being between said membrane and said assist layer, said at least one aperture terminating at said assist layer; and
   a frame, said assist layer being between said support layer and said frame, an opening extending through said frame to said support layer, said opening being in alignment with said at least one hole, said opening being larger than said at least one aperture.

2. A mask as set forth in claim 1, wherein a portion of said assist layer in alignment with said opening being removable.

3. A mask as set forth in claim 1, wherein said support layer is of a material different from said membrane.

4. A mask as set forth in claim 1, wherein said frame is of a material different from said assist layer.

5. A mask as set forth in claim 1, wherein said membrane is a single crystal silicon layer, a polycrystalline silicon layer, an amorphous silicon layer, or a diamond layer.

6. A mask as set forth in claim 1, wherein said support layer is a silicon oxide layer, a silicon nitride layer, a silicon oxynitride layer, a diamond layer, a diamond-like carbon (DLC) layer, or a metal layer.

7. A mask as set forth in claim 1, wherein said assist layer is a silicon nitride layer.

8. A mask as set forth in claim 1, wherein said frame is a silicon wafer.

9. A mask as set forth in claim 1, wherein said at least one hole is a single hole and said at least one aperture is a single aperture.

10. A mask as set forth in claim 1, wherein said at least one hole is a plurality of holes and said at least one aperture is a single aperture.

11. A mask as set forth in claim 1, wherein a charged particle beam passes through said at least one hole.

12. A mask as set forth in claim 11, wherein said charged particle beam includes an electron beam.

13. A mask comprising:
- a membrane, at least one hole extending through said membrane;
- a support layer, at least one aperture extending though said support layer, said at least one aperture being self-aligned with said at least one hole, said at least one aperture being larger than said at least one hole;
- an etching stopper layer, said support layer being between said membrane and said etching stopper layer, said at least one aperture terminating at said etching stopper layer; and
- a frame, said membrane being between said support layer and said frame, an opening extending through said frame to said membrane, said opening being in alignment with said at least one hole, said opening being larger than said at least one aperture.

14. A mask as set forth in claim 13, wherein said etching stopper layer is removable to expose said support layer.

15. A mask as set forth in claim 13, wherein said support layer is of a material different from said membrane.

16. A mask as set forth in claim 13, wherein said frame is of a material different from said etching stopper layer.

17. A mask as set forth in claim 13, wherein said membrane is a single crystal silicon layer, a polycrystalline silicon layer, an amorphous silicon layer, or a diamond layer.

18. A mask as set forth in claim 13, wherein said support layer is a silicon oxide layer, a silicon nitride layer, a silicon oxynitride layer, a diamond layer, a diamond-like carbon (DLC) layer, or a metal layer.

19. A mask as set forth in claim 13, wherein said etching stopper layer is a silicon nitride layer.

20. A mask as set forth in claim 13, wherein said frame is a silicon wafer.

21. A mask as set forth in claim 13, wherein said at least one hole is a single hole and said at least one aperture is a single aperture.

22. A mask as set forth in claim 13, wherein said at least one hole is a plurality of holes and said at least one aperture is a single aperture.

23. A mask as set forth in claim 13, wherein a charged particle beam passes through said at least one hole.

24. A mask as set forth in claim 13, wherein said charged particle beam includes an electron beam.

25. A mask as set forth in claim 13, further comprising:
- another etching stopper layer between said frame and said membrane, a portion of said another etching stopper layer in alignment with said opening being removable.

* * * * *